United States Patent
Yoshida et al.

(10) Patent No.: US 9,952,615 B2
(45) Date of Patent: Apr. 24, 2018

(54) CHARGE PUMP AND VOLTAGE GENERATION CIRCUIT

(71) Applicant: Toshiba Memory Corporation, Tokyo (JP)

(72) Inventors: Mizuho Yoshida, Yokohama Kanagawa (JP); Junji Musha, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/060,447

(22) Filed: Mar. 3, 2016

(65) Prior Publication Data

US 2016/0291629 A1   Oct. 6, 2016

(30) Foreign Application Priority Data

Apr. 1, 2015  (JP) .................... 2015-075367

(51) Int. Cl.
| | |
|---|---|
| *G05F 3/16* | (2006.01) |
| *H03K 5/14* | (2014.01) |
| *H02M 3/07* | (2006.01) |
| *G11C 5/14* | (2006.01) |
| *G11C 16/04* | (2006.01) |
| *G11C 16/30* | (2006.01) |
| *G11C 16/32* | (2006.01) |

(52) U.S. Cl.
CPC ............. *G05F 3/16* (2013.01); *G11C 5/145* (2013.01); *G11C 16/0483* (2013.01); *G11C 16/30* (2013.01); *H02M 3/07* (2013.01); *H03K 5/14* (2013.01); *G11C 16/32* (2013.01)

(58) Field of Classification Search
CPC .. G05F 3/16; H03K 5/14; G11C 16/30; G11C 16/32; G11C 16/0483; G11C 5/145; H02M 3/07
USPC ....................................... 327/536
See application file for complete search history.

(56) References Cited

U.S. PATENT DOCUMENTS

2012/0146451 A1* 6/2012 Nitta .................... B41J 2/04541
                                                          310/300

* cited by examiner

*Primary Examiner* — Patrick Chen
(74) *Attorney, Agent, or Firm* — Patterson & Sheridan, LLP

(57) ABSTRACT

A charge pump includes a capacitor, a first transistor that is electrically connected between a first terminal of the first capacitor and ground, and a second transistor that is electrically connected between a second terminal of the first capacitor and an output node. During a first operation mode of the charge pump, a voltage that is boosted using the capacitor is output through the output node, and during a second operation mode of the charge pump, the first transistor and the second transistor are maintained in an ON state.

5 Claims, 11 Drawing Sheets

CHARGE PUMP AND VOLTAGE GENERATION CIRCUIT

CROSS-REFERENCE TO RELATED APPLICATION

This application is based upon and claims the benefit of priority from Japanese Patent Application No. 2015-075367, filed Apr. 1, 2015, the entire contents of which are incorporated herein by reference.

FIELD

Embodiments described herein relate generally to a charge pump and a voltage generation circuit.

BACKGROUND

In a semiconductor memory device, a voltage generation circuit which includes a charge pump is used.

DETAILED DESCRIPTION

Figure 1:
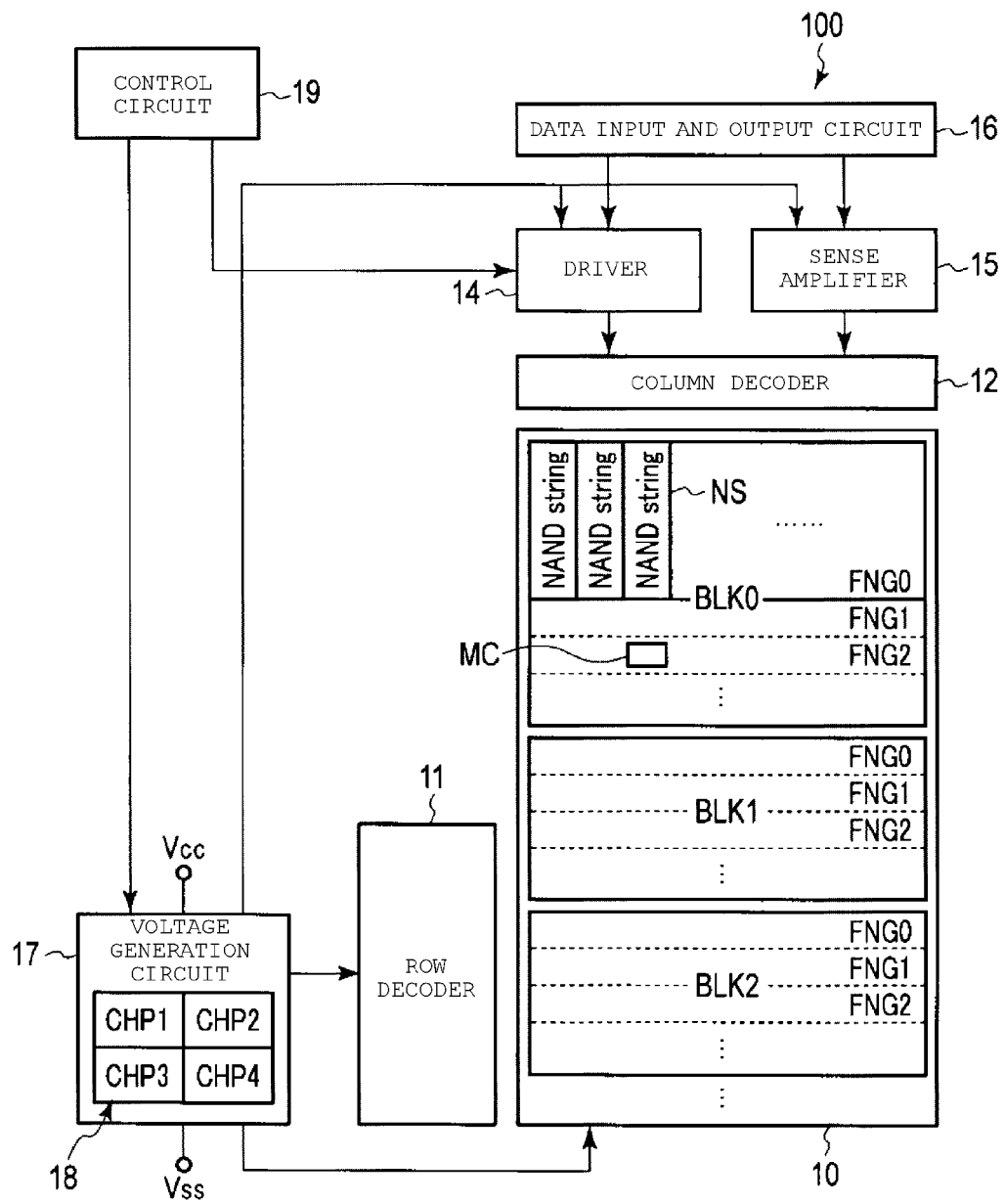
FIG. 1 is a functional block diagram illustrating a semiconductor memory device according to a first embodiment.

Embodiments now will be described more fully hereinafter with reference to the accompanying drawings. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, such elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, when the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, when the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross section and perspective illustrations that are schematic illustrations of the embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Embodiments provide a charge pump and a voltage generation circuit which may supply a stable voltage.

In general, according to one embodiment, a charge pump includes a capacitor, a first transistor electrically connected between a first terminal of the capacitor and ground, and a second transistor electrically connected between a second terminal of the capacitor and an output node. During a first operation mode of the charge pump, a voltage that is boosted using the first capacitor is output through the output node, and during a second operation mode of the charge pump, the first transistor and the second transistor are maintained in an ON state.

A semiconductor memory device according to embodiments will be described below with reference to the drawings. In the drawings, the same symbols or reference numerals will be given to the same elements. In addition, it is not essential that each functional block is distinguished from each other as in the following example. For example, partial functions may be performed by a functional block different from a functional block which is provided as an example. Further, such a functional block may be divided into finer functional sub-blocks.

First Embodiment

As illustrated in FIG. 1, a memory device 100 includes a memory cell array 10, a row decoder 11, a column decoder 12, a sense amplifier 15, a data input and output circuit 16, a voltage generation circuit 17, and a control circuit 19.

The memory cell array 10 includes a plurality of memory cells MC. The configurations of the memory cells MC and the memory cell array 10 are arbitrary. For example, the memory cell array 10 includes a plurality of blocks, each block includes a plurality of fingers FNG, each finger FNG including a plurality of NAND strings NS, and each string NS including a plurality of memory cells MC. The memory cells MC includes, for example, an insulating film, and retains data based on the amount of electrons in the insulating film. The memory cell MC is connected to a wire, such as a word line, a bit line, or a source line. Various voltages are applied to various wires so as to write data to, read the data from, erase the data in the memory cell MC, or the like. The memory cells MC of the memory cell array 10 are arranged in, for example, a three-dimensional configuration.

For example, the configuration of the memory cell array may be as described in U.S. patent application Ser. No. 12/407,403, filed Mar. 19, 2009, entitled "THREE-DIMENSIONALLY STACKED NON-VOLATILE SEMICONDUCTOR MEMORY." In addition, the configuration of the memory cell array may be as described in U.S. patent application Ser. No. 12/406,524, filed Mar. 18, 2009, entitled "THREE-DIMENSIONALLY STACKED NON-VOLATILE SEMICONDUCTOR MEMORY." In addition, the configuration of the memory cell array may be as described in U.S. patent application Ser. No. 12/679,991, filed Mar. 25, 2010, entitled "NON-VOLATILE SEMICONDUCTOR MEMORY DEVICE AND METHOD THEREOF." In addition, the configuration of the memory cell array may be as described in U.S. patent application Ser. No. 12/532,030, filed Mar. 23, 2009, entitled "SEMICONDUCTOR MEMORY AND METHOD THEREOF." The entire contents of these patent applications are incorporated herein by reference.

The row decoder 11 selects a word line based on an address signal. The column decoder 12 selects a bit line based on the address signal. The sense amplifier 15 senses data that is read from the memory cell MC which is selected by the row decoder 11 and the column decoder 12.

The voltage generation circuit 17 includes a charge pump system 18. The charge pump system 18 generates various voltages from a voltage Vcc and a ground voltage Vss. The voltage Vcc is a power supply voltage that is supplied from outside the memory device 100. The voltages have various values based on operations (reading, writing, erasing, or the like) to be carried out in the memory device 100, and are supplied to the memory cell array 10, the row decoder 11, a driver 14, the sense amplifier 15, and the like.

The driver 14 receives various voltages from the voltage generation circuit 17, and applies the received voltages to wires such as a word line, a bit line, and a source line.

The control circuit 19 controls the memory cell array 10, the row decoder 11, the column decoder 12, the driver 14, the data input and output circuit 16, and the voltage generation circuit 17.

Configuration of Charge Pump System

Figure 2:
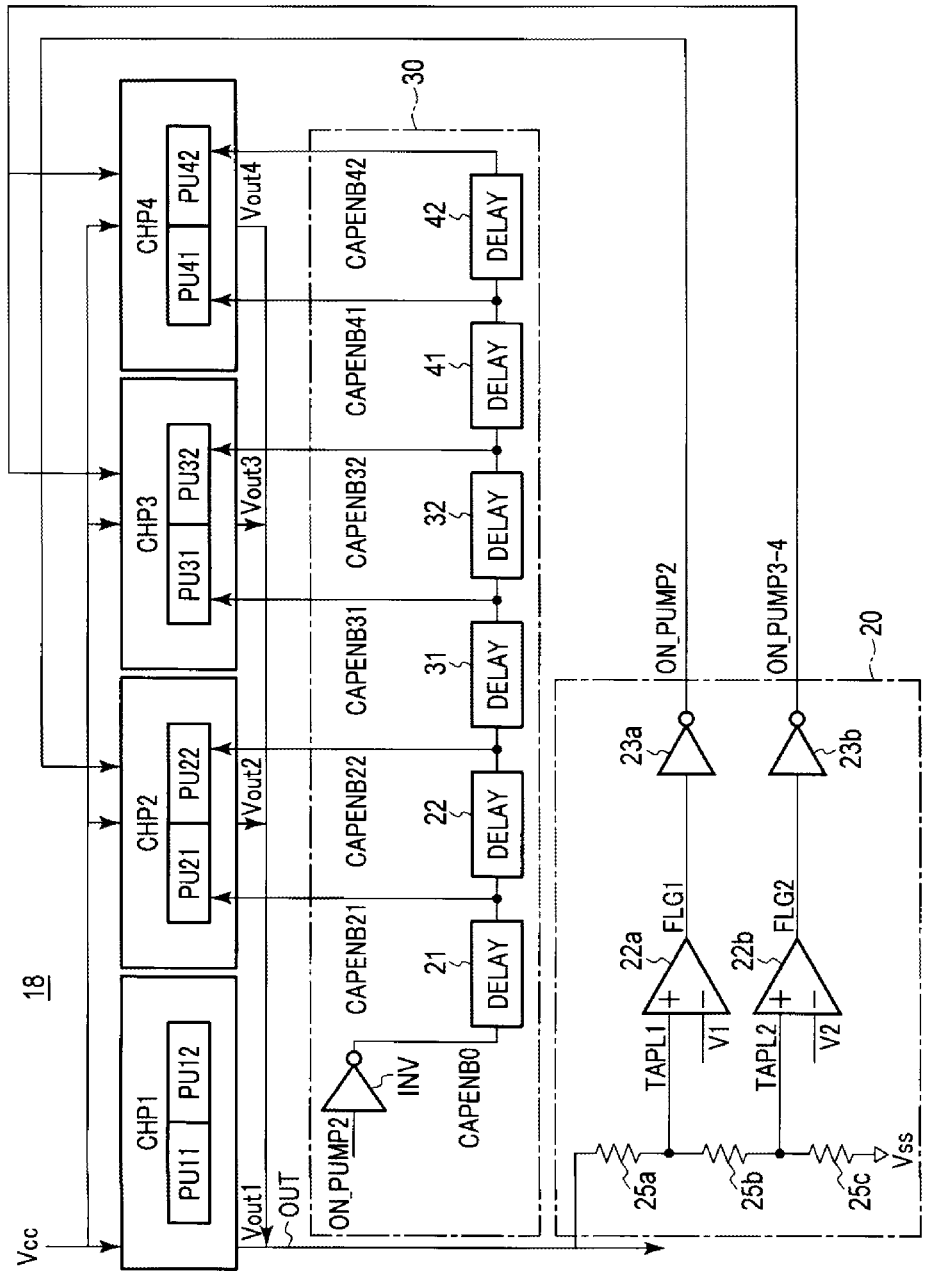
FIG. 2 is a schematic diagram illustrating a charge pump system according to the first embodiment.

The charge pump system 18 includes, for example, four charge pumps CHP1 to CHP4, a pump control circuit 20, and a pool capacitor control circuit 30, as illustrated in FIG. 2. The number of charge pumps may be three, five, or more.

Each of the charge pumps CHP1 to CHP4 receives the voltage Vcc, boosts the voltage Vcc, and outputs the boosted voltage. An output node Vout1 of the charge pump CHP1, an output node Vout2 of the charge pump CHP2, an output node Vout3 of the charge pump CHP3, and an output node Vout4 of the charge pump CHP4 are connected to an output node OUT of the charge pump system 18. The output node OUT of the charge pump system 18 is an output node of the voltage generation circuit 17.

The charge pump CHP1 includes pump units PU11 and PU12. The charge pump CHP2 includes pump units PU21 and PU22. The charge pump CHP3 includes pump units PU31 and PU32. The charge pump CHP4 includes pump units PU41 and PU42. The charge pumps CHP2 to CHP4 may operate respectively as a pool capacitor, in addition to operating as a charge pump. The charge pumps CHP1 to CHP4 will be described in more detail later.

The pump control circuit 20 controls operations of the charge pumps CHP1 to CHP4. In the pump control circuit 20, resistor elements 25a, 25b, and 25c are connected in series to each other between the output node OUT and the ground (node of the voltage Vss).

A connection node TAPL1 connected between the resistor elements 25a and 25b is connected to a non-inverting input terminal of an operational amplifier 22a. An inverting input terminal of the operational amplifier 22a receives a reference voltage V1. The operational amplifier 22a outputs a signal FLG1 of a low level, when a voltage on the node TAPL1 is lower than the voltage V1. An inverter 23a receives the signal FLG1. The inverter 23a outputs a signal ON_PUMP2. The signal ON_PUMP2 of a high level enables the charge pump CHP2 to operate as a charge pump. Resistance values of the resistor elements 25a, 25b, and 25c, and the reference voltage V1 (also referred to as VREF1) are set, in such a manner that, when a voltage on the output node OUT is lower than the reference voltage VREF1, the signal FLG1 of a low level is output. Accordingly, when a voltage on the output node OUT is lower than the voltage VREF1, the charge pump CHP2 is enabled as a charge pump. The voltage VREF1 is smaller than a voltage Vspc. The voltage Vspc is a target voltage that the charge pump system 18 outputs from the output node OUT.

A connection node TAPL2 connected between the resistor elements 25b and 25c is connected to a non-inverting input terminal of the operational amplifier 22b. An inverting input terminal of the operational amplifier 22b receives a reference voltage V2. The operational amplifier 22b outputs a signal FLG2 of a low level, when a voltage on the node TAPL2 is lower than the voltage V2. An inverter 23b receives the signal FLG2. The inverter 23b outputs signals ON_PUMP3 and ON_PUMP4. The signals ON_PUMP3 and ON_PUMP4 of a high level enable the charge pumps CHP3 and CHP4 to operate as charge pumps. Resistance values of the resistor elements 25a, 25b, and 25c, and the reference voltage V2 (also referred to as VREF2) are set, in such a manner that, when a voltage on the output node OUT is lower than the reference voltage VREF2, the signal FLG2 of a low level is output. Accordingly, when a voltage on the output node OUT is lower than the voltage VREF2, the charge pumps CHP3 and CHP4 are enabled as a charge pump. The voltage VREF2 is smaller than the voltage VREF1.

The pool capacitor control circuit 30 also controls the operations of the charge pumps CHP2 to CHP4. The pool capacitor control circuit 30 includes an inverter INV, and delay circuits 21, 22, 31, 32, 41, and 42 which are connected in series to each other. The inverter INV receives the signal ON_PUMP2, and supplies a signal CAPENB0 to the delay circuit 21.

The delay circuit 21 supplies the signal CAPENB0 to the pump unit PU21 as a signal CAPENB21 after a certain delay. The signal CAPENB21 of a high level causes the pump unit PU21 to operate as a pool capacitor. The delay circuit 22 supplies the signal CAPENB21 to the pump unit PU22 as a signal CAPENB22 after a certain delay. The signal CAPENB22 of a high level causes the pump unit PU22 to operate as a pool capacitor.

The delay circuit 31 supplies the signal CAPENB22 to the pump unit PU31 as a signal CAPENB31 after a certain delay. The signal CAPENB31 of a high level causes the pump unit PU31 to operate as a pool capacitor. The delay circuit 32 supplies the signal CAPENB31 to the pump unit PU32 as a signal CAPENB32 after a certain delay. The signal CAPENB32 of a high level causes the pump unit PU32 to operate as a pool capacitor.

The delay circuit 41 supplies the signal CAPENB32 to the pump unit PU41 as a signal CAPENB41 after a certain delay. The signal CAPENB41 of a high level causes the pump unit PU41 to operate as a pool capacitor. The delay circuit 42 supplies the signal CAPENB41 to the pump unit PU42 as a signal CAPENB42 after a certain delay. The signal CAPENB42 of a high level causes the pump unit PU42 to operate as a pool capacitor.

When receiving the signal ON_PUMP2 of a low level, the pool capacitor control circuit 30 sequentially outputs the signals CAPENB21, CAPENB22, CAPENB31, CAPENB32, CAPENB41, and CAPENB42 which are all low levels, at designated times.

Configuration of Charge Pump

Figure 3:
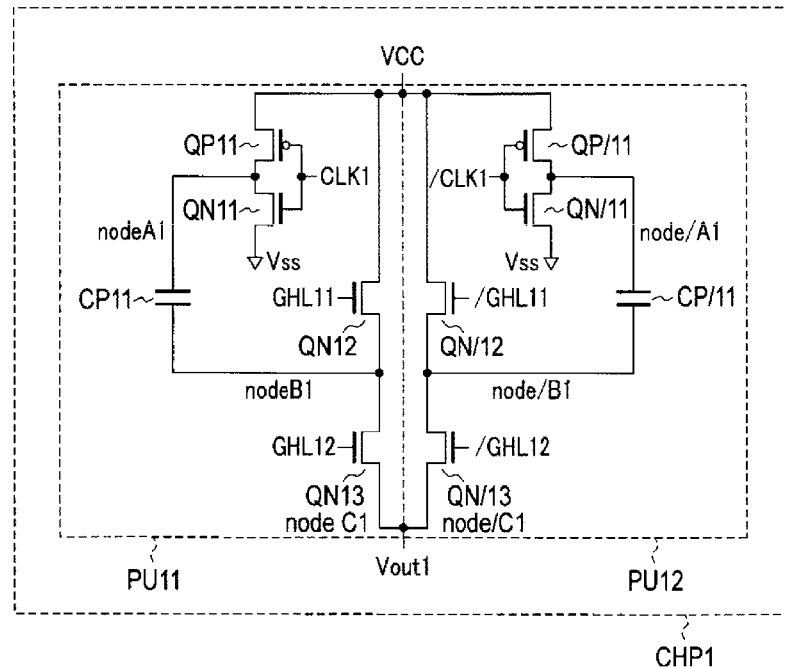
FIG. 3 is a schematic diagram illustrating a charge pump according to the first embodiment.

FIG. 3 illustrates a configuration of the charge pump CHP1. The pump unit PU11 includes n-type metal oxide semiconductor field effect transistors (MOSFETs) QN12 and QN13 which are connected in series to each other between a node (power supply node) Vcc of the voltage Vcc and a node C1. A gate of the transistor QN12 receives a signal GHL11 from the control circuit 19. A gate of the transistor QN13 receives a signal GHL12 from the control circuit 19.

The pump unit PU11 also includes a p-type MOSFET QP11 and an n-type MOSFET QN11 which are connected in series to each other between the node Vcc and the ground (ground node). Gates of the transistors QP11 and QN11 receive a signal CLK1 from the control circuit 19. A node (node A1) to which the transistors QP11 and QN11 are connected is connected to one terminal of a capacitor CP11. The other terminal (node B1) of the capacitor CP11 is connected to a node to which the transistors QN12 and QN13 are connected.

The pump unit PU12 has the same configuration as the pump unit PU11. That is, the pump unit PU12 includes a p-type MOSFET QP/11, n-type MOSFETs QN/11, QN/12, and QN/13, and a capacitor CP/11. The transistor QP/11 corresponds to the transistor QP11, the transistor QN/11 corresponds to the transistor QN11, the transistor QN/12 corresponds to the transistor QN12, the transistor QN/13 corresponds to the transistor QN13, and the capacitor CP/11 corresponds to the capacitor CP11. The transistors QP/11, QN/11, QN/12, and QN/13, and the capacitor CP/11 are connected in the same manner as the corresponding elements of the pump unit PU11.

Gates of the transistors QP/11 and QN/11 receive a signal /CLK1 from the control circuit 19, a gate of the transistor QN/12 receives a signal /GHL11 from the control circuit 19, and a gate of the transistor QN/13 receives a signal /GHL12 from the control circuit 19. The symbol "/" of the signal represents inversion of the signal of the name that follows the symbol "/". Nodes of opposite terminals of the capacitor CP/11 are referred to as nodes /A1 and /B1, and a source of the transistor QN13 is referred to as a node /C1.

Figure 4:
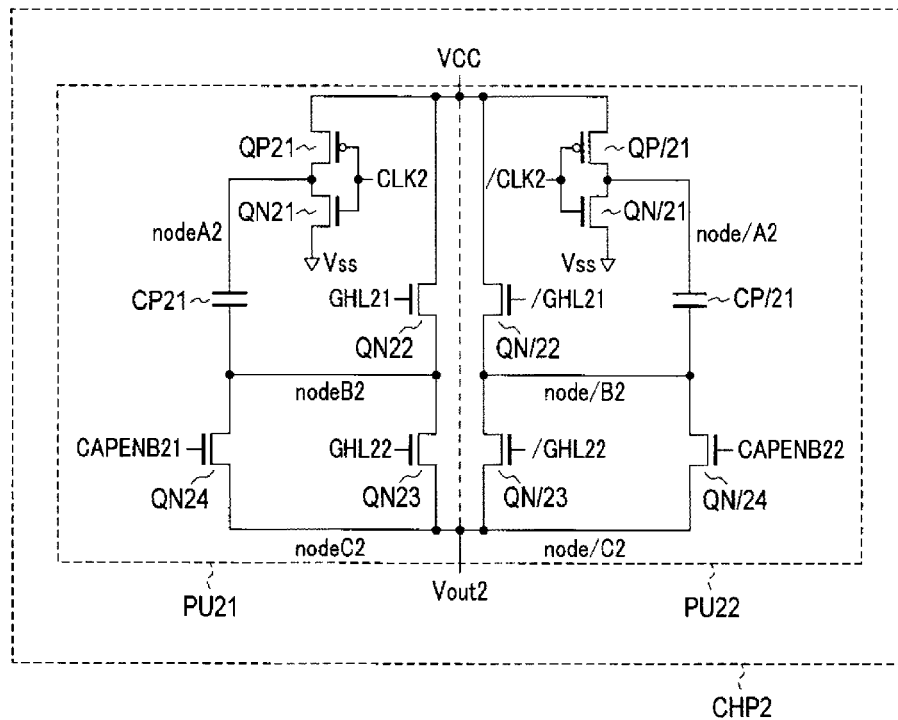
FIG. 4 is a schematic diagram illustrating another charge pump according to the first embodiment.

The charge pump CHP2 has a configuration which is illustrated in FIG. 4. First, the charge pump CHP2 has the same configuration as the charge pump CHP1. That is, the charge pump CHP2 includes the pump units PU21 and PU22, and the pump unit PU21 includes a p-type MOSFET QP21, n-type MOSFETs QN21 to QN23, and a capacitor CP21. The transistor QP21 corresponds to the transistor QP11, the transistor QN21 corresponds to the transistor QN11, the transistor QN22 corresponds to the transistor QN12, the transistor QN23 corresponds to the transistor QP13, and the capacitor CP21 corresponds to the capacitor CP11. The transistors QP21, QN21, QN22, and QN23, and the capacitor CP21 are connected in the same manner as the corresponding elements of the pump unit PU11. A node A2 corresponds to the node A1, a node B2 corresponds to the node B1, and a node C2 corresponds to the node C1.

Gates of the transistors QP21 and QN21 receive a signal CLK2 from the control circuit 19, a gate of the transistor QN22 receives a signal GHL21 from the control circuit 19, and a gate of the transistor QN23 receives a signal GHL22 from the control circuit 19.

The pump unit PU21 further includes an n-type MOSFET QN24 connected between the node B2 and the node C2. The transistor QN24 receives a signal CAPENB21.

The pump unit PU22 has the same configuration as the pump unit PU21, and an n-type MOSFET QN/24. That is, the pump unit PU22 includes a p-type MOSFET QP/21, n-type MOSFETs QN/21, QN/22, and QN/23, and a capacitor CP/21. The transistor QP/21 corresponds to the transistor QP21, the transistor QN/21 corresponds to the transistor QN21, the transistor QN/22 corresponds to the transistor QN22, the transistor QN/23 corresponds to the transistor QN23, and the capacitor CP/21 corresponds to the capacitor CP21. A node /A2 corresponds to the node A2, a node /B2 corresponds to the node B2, and a node /C2 corresponds to the node C2. A transistor QN/24 is connected between a node /B2 and a node /C2 to which the transistor QN/22 and the transistor QN/23 are respectively connected. Gates of the transistors QP/21 and QN/21 receive a signal /CLK2 from the control circuit 19. A gate of the transistor QN/22 receives a signal /GHL21 from the control circuit 19. A gate of the transistor QN/23 receives a signal /GHL22 from the control circuit 19. A gate of the transistor QN/24 receives a signal CAPENB22.

The charge pumps CHP3 and CHP4 have the same configuration as the charge pump CHP2. That is, the pump units PU31 and PU41 have the same configuration as the pump unit PU21, and the pump units PU32 and PU42 have the same configuration as the pump unit PU22. However, signals which are received are different from each other, as follows. That is, in the pump unit PU31, a gate of the transistor QN24 receives the signal CAPENB31. In the pump unit PU32, a gate of the transistor QN/24 receives the signal CAPENB32. In the pump unit PU41, a gate of the transistor QN/24 receives the signal CAPENB41. In the pump unit PU42, a gate of the transistor QN/24 receives the signal CAPENB42.

One of, a plurality of, or all of the charge pumps CHP1 to CHP4 may include three or more pump units.

Operation of Charge Pump

An operation of the charge pump CHP2 will be described with reference to FIG. 5 to FIG. 10. The operations of the charge pumps CHP3 and CHP4 are also the same as the operation which will be described below.

While the pump unit PU21 operates as a charge pump, the signal CAPENB21 is at a low level. On the other hand, while the pump unit PU21 operates as a pool capacitor, the signal CAPENB21 is at a high level. In the same manner, while operating as a charge pump, the pump unit PU22 receives the signal CAPENB22 of a low level, and while operating as a pool capacitor, the pump unit PU22 receives the signal CAPENB22 of a high level.

Figure 5:
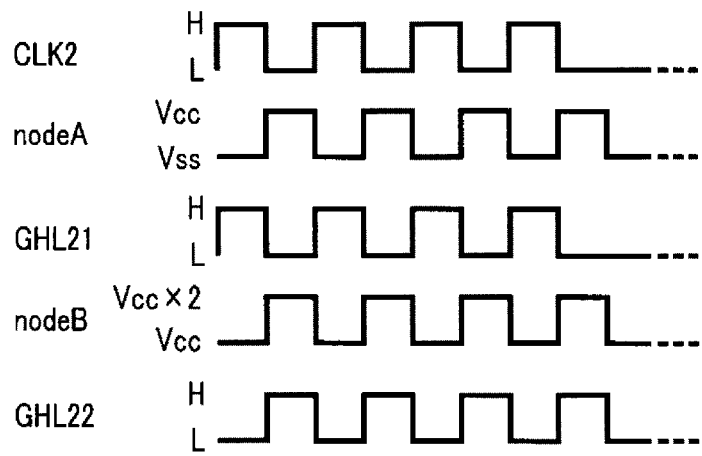
FIG. 5 is a waveform diagram illustrating signals in the charge pump according to the first embodiment.
Figure 6:
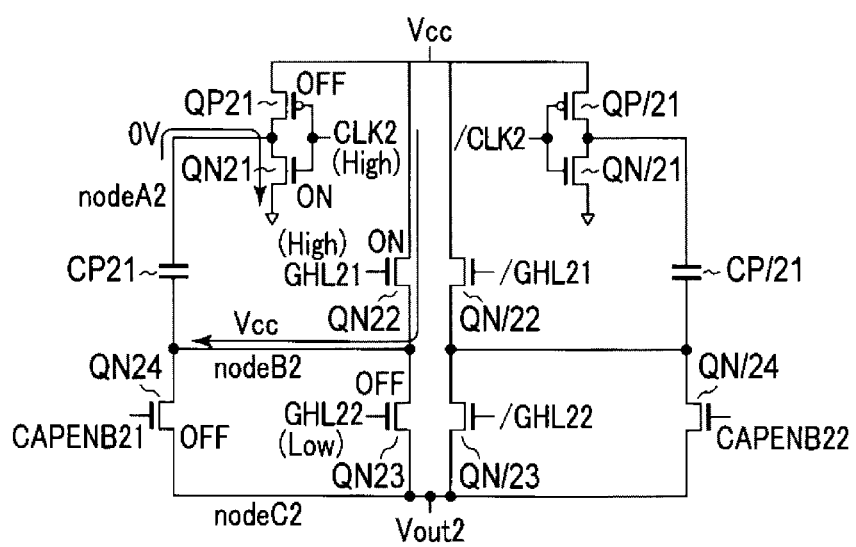
FIG. 6 illustrates one state of the charge pump according to the first embodiment.
Figure 7:
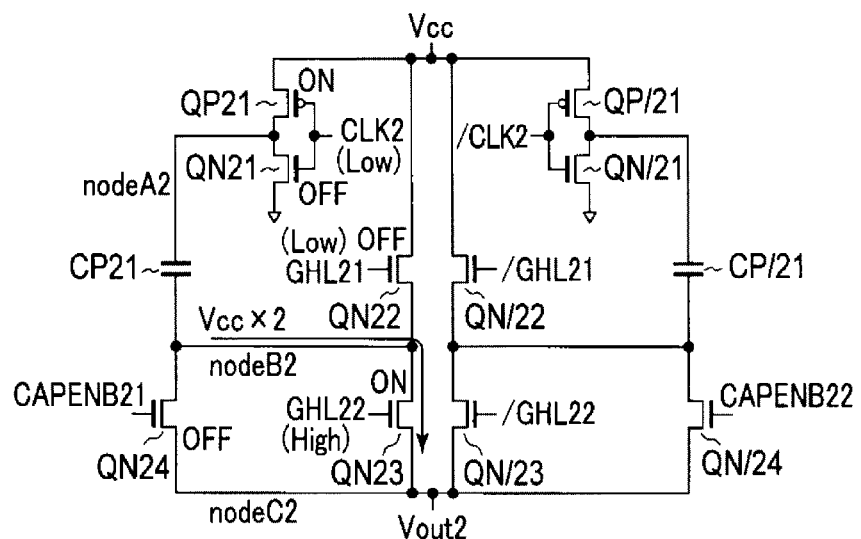
FIG. 7 illustrates another state of the charge pump according to the first embodiment.

First, a charge pumping operation of the charge pump CHP2 is illustrated in FIG. 5 to FIG. 7. An operation of the charge pump CHP1 is the same as the following operation.

As illustrated in FIG. 5, the signal CLK2 is alternately changed to a high level and a low level (performs clocking). The signal GHL21 has the same phase as the signal CLK2, and the signal GHL22 has a reverse phase relative to the signal CLK2.

By clocking of the signals CLK2, GHL21, and GHL22 in this manner, the transistors QN21, QP21, QN22, and QN23 are alternately turned on and off. FIG. 6 illustrates a state in which the signal CLK2 is in a high level. As illustrated in FIG. 6, the transistor QP21 is turned off, and the transistor QN21 is turned on. For this reason, a voltage on the node A2 is the voltage Vss (0 V). Meanwhile, since the transistor QN22 is turned on, a voltage on the node B2 is the voltage Vcc. As a result, the voltage Vcc is charged in the capacitor CP21. The signal GHL21 of a high level is much higher than the voltage Vcc, in such a manner that the transistor Qn22 may transfer the voltage Vcc.

FIG. 7 illustrates a state in which the signal CLK2 is at a low level. Each transistor and a node state are changed by the signal CLK2 being transitioned to a low level. As illustrated in FIG. 7, the transistor QP21 is turned on, and the transistor QN21 is turned off. By turning on of the transistor QP21, a voltage on the node A2 is increased in accordance with a current flowing from the node Vcc. At this time, the capacitor CP21 maintains a potential difference Vcc between a potential on the node A2 and a potential on the node B2 which are unchanged. As a result, a voltage on the node B2 is increased to Vcc×2 from the unchanged voltage Vcc. Thus, the voltage Vcc×2 on the node B2 is output from the output node Vout2 via the transistor QN23.

The operations of FIG. 6 to FIG. 7 are repeated by clocking of the signals CLK2, GHL21, and GHL22, whereby a voltage which is periodically changed between the voltage Vcc and the voltage Vcc×2 is output from the node Vout2.

The pump unit PU22 receives the signals CLK2, /GHL21, and /GHL22, and performs the same operation as the operation of the pump unit PU21 that is described with reference to FIG. 5 to FIG. 7, in parallel with the pump unit PU21. However, since the signal /GHL21 has a reverse phase relative to the signal GHL21 and the signal /GHL22 has a reverse phase relative to the signal GHL22, an output of the voltage Vcc×2 generated by the pump unit PU21, and an output voltage Vcc×2 generated by the pump unit PU22 are alternately performed. As a result, a voltage with a magnitude of the voltage Vcc×2 is continuously output from the node Vout2.

Figure 8:
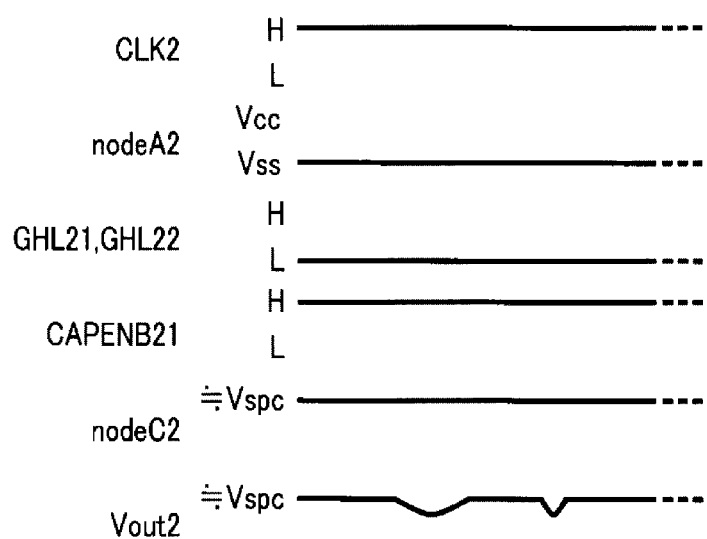
FIG. 8 is a waveform diagram illustrating signals in the charge pump according to the first embodiment.
Figure 9:
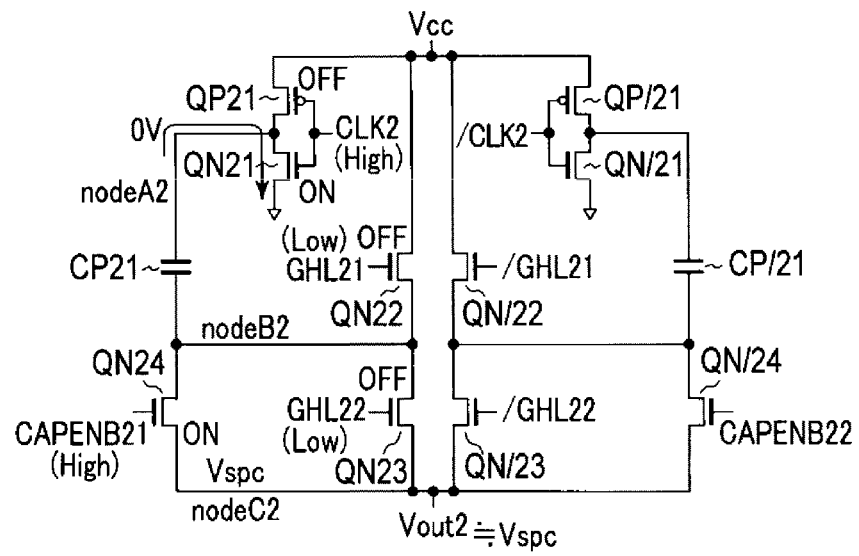
FIG. 9 illustrates still another state of the charge pump according to the first embodiment.
Figure 10:
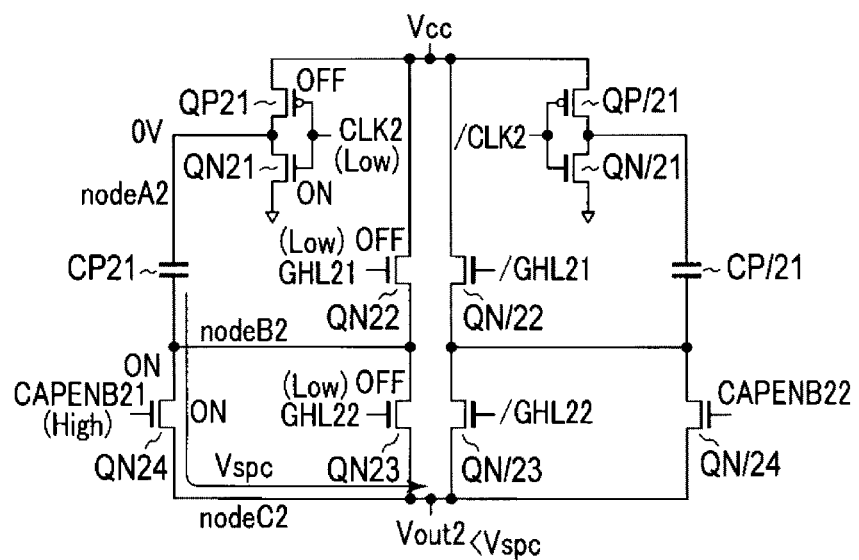
FIG. 10 illustrates still another state of the charge pump according to the first embodiment.

A pool capacitor operation of the charge pump CHP2 is illustrated in FIG. 8 to FIG. 10. The pool capacitor generally indicates a capacitor connected between an output node of a charge pump and the ground, accumulates charges, and discharges the accumulated charges, when the output voltage of the charge pump is lower than a target voltage. FIG. 8 illustrates a case in which only the pump unit PU21 of the pump units PU21 and PU22 operates as a pool capacitor. Thus, the signal CAPENB21 is maintained at a high level.

As illustrated in FIG. 8, the signal CLK2 is maintained at a high level, the signals GHL21 and GHL22 are maintained at a low level (voltage Vss), and in addition, as described above, the signal CAPENB21 is maintained at a high level. As a result, the transistors QN21 and QN24 are turned on. Thus, the node A2 is grounded, and the node B2 is connected to the node C2 via the transistor QN24. For this reason, the capacitor CP21 may operate as a pool capacitor.

FIG. 9 illustrates a state in which the output node Vout2, that is, the output node OUT of the charge pump system is substantially equal to a target voltage Vspc. The target voltage Vspc is a voltage to be output from the output node OUT by the charge pump system 18 of FIG. 2. During the state of FIG. 9, the node C2 receives the voltage Vspc, and thus substantially the same voltage Vspc as the target voltage is accumulated in the capacitor CP21. As illustrated in FIG. 8, when a voltage on the node Vout2 is lower than the target voltage Vspc, the pump unit PU21 is changed to a state illustrated in FIG. 10. In the state of FIG. 10, both ends of the capacitor CP21 is maintained at the voltage Vspc before changing to a state of FIG. 10. For this reason, a voltage on the node C2 is the voltage Vspc and a voltage on the node Vout2 is lower than the voltage Vspc, and thereby there occurs a potential difference between a potential on the node C2 and a potential on the node Vout2. As a result, the charges accumulated in the capacitor CP21 flow into the node Vout2, and a voltage on the node Vout2 increases.

Operation of Charge Pump System

Figure 11:
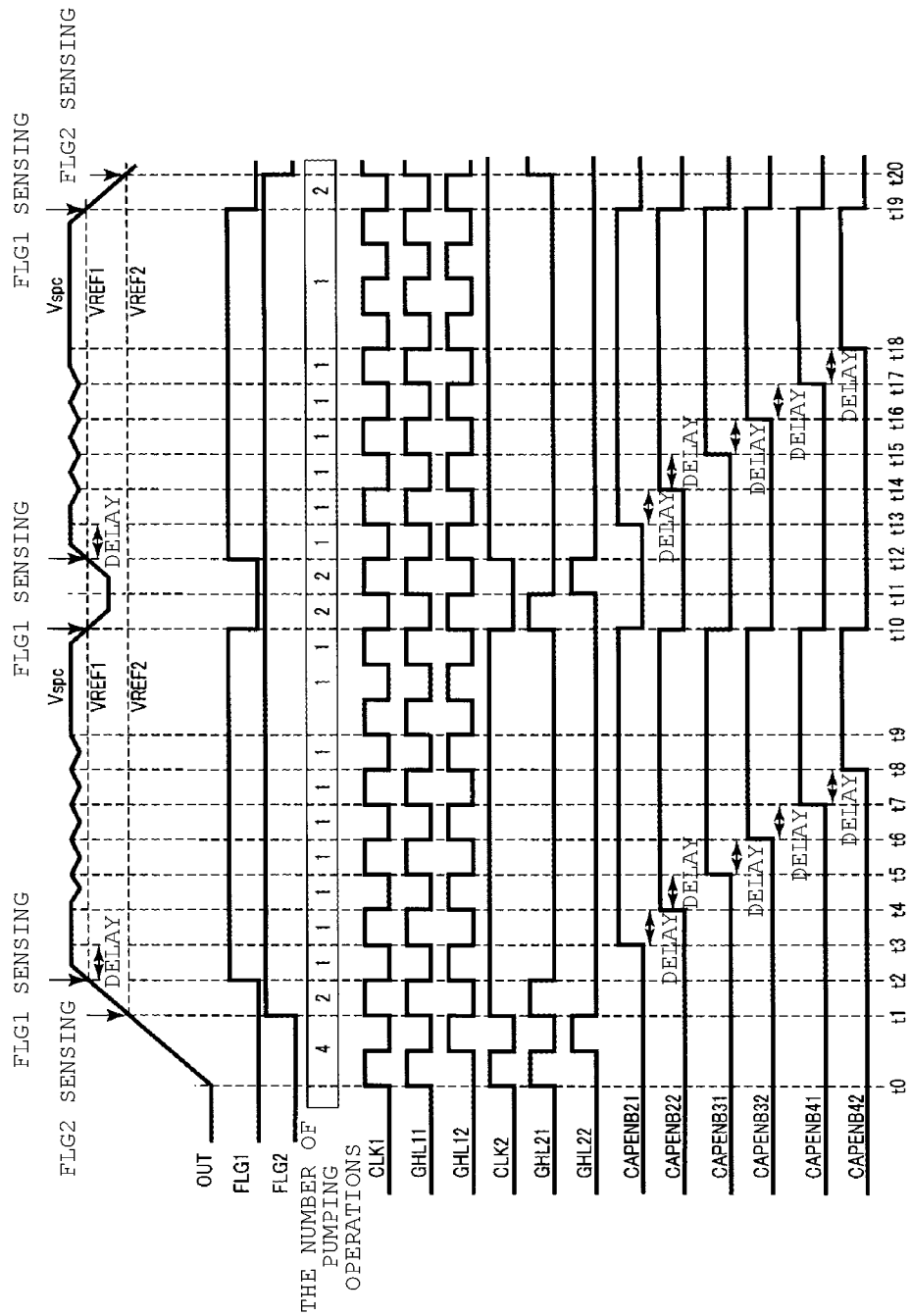
FIG. 11 is a waveform diagram illustrating signals in the charge pump system according to the first embodiment.

An operation of the charge pump system 18 will be described with reference to FIG. 11. Before the operation of the charge pump system 18 starts, a voltage on the node OUT is, for example, 0 V. When starting operation, the charge pump system 18 enables the charge pump CHP1 at a time t0. While the charge pump CHP1 is enabled, the control circuit 19 continuously performs clocking of the signals CLK1, GHL11, and GHL12. The charge pump CHP1 continuously operates while the charge pump system 18 operates.

Since the voltage on the node OUT is lower than the voltage VREF2, the signals FLG1 and FLG2 are at a low level. Thus, the pump control circuit 20 outputs the signals ON_PUMP2, ON_PUMP3, ON_PUMP4 which are at a high level. As a result, the charge pumps CHP2 to CHP4 are enabled as a charge pump. While the charge pumps CHP2 to CHP4 are enabled, the control circuit 19 continuously performs the clocking of the signals CLK2, GHL21, and GHL22. By the clocking of the signals CLK2, GHL21, and GHL22, the charge pumps CHP2 to CHP4 operates as a charge pump. As a result, the voltage on the node OUT increases.

Since the signal ON_PUMP2 is at a high level, the signals CAPENB21, CAPENB22, CAPENB31, CAPENB32, CAPENB41, and CAPENB42 go to a low level at a point of the time t0.

At a time t1, when a voltage on the node OUT is increased to a voltage equal to or higher than the voltage VREF2, the pump control circuit 20 increases the signal FLG2 to a high level, and in addition, decreases the signals ON_PUMP3 and ON_PUMP4 to a low level. Because the signals ON_PUMP3 and ON_PUMP4 are at a low level, the charge pumps CHP3 and CHP4 are disabled as a charge pump.

At a time t2, when the voltage on the node OUT is equal to or higher than the voltage VREF1, the pump control circuit 20 increases the signal FLG1 to a high level, and in addition, decreases the signal ON_PUMP2 to a low level. Because the signal ON_PUMP2 is at a low level, the charge pump CHP2 is disabled as a charge pump. In addition, the control circuit 19 receives the signal ON_PUMP2 which is transitioned to a low level, stops the clocking of the signals CLK2, GHL21, and GHL22, increases the signal CLK2 to a high level, and decreases the signals GHL21 and GHL22 to a low level. Fixing of the levels of the signals CLK2, GHL21, and GHL22 is continued while the signal FLG1 is at a high level.

In addition, since the signal FLG1 is at a high level (the signal ON_PUMP2 is at a low level) at a time t2, the signals CAPENB21, CAPENB22, CAPENB31, CAPENB32, CAPENB41, and CAPENB42 sequentially go to a high level. As a result, the pump units PU21, PU22, PU31, PU32, PU41, and PU42 sequentially operate as pool capacitors. Because of the pool capacitor operation, the voltage on the node OUT rapidly increases up to the target voltage Vspc, even when the voltage is lower than the target voltage Vspc. The pump units PU21, PU22, PU31, PU32, PU41, and PU42 is maintained in an enabled state as a pool capacitor, until the signal FLG1 goes to a low level.

At a time t10, when a voltage on the node OUT is lower than the reference voltage VREF1, the signal FLG1 goes to a low level. As a result, the signals CAPENB21, CAPENB22, CAPENB31, CAPENB32, CAPENB41, and CAPENB42 go to a low level, and the pump units PU21, PU22, PU31, PU32, PU41, and PU42 completes the pool capacitor operation. In addition, based on each time the signal FLG1 goes to a low level, the control circuit 19 makes the charge pump CHP2 operate as a charge pump, in the same manner as the operation at times t0 to t1.

At a time t12, when the voltage on the node OUT is higher than the reference voltage VREF1, the same operation as the operation performed from the time t2 is performed. At a time t19, when the voltage VOUT is lower than the reference voltage VREF1, the same operation as the operation performed from the time t10 is performed. Further, at a time t20, when the voltage VOUT is lower than the reference voltage VREF2, the control circuit 19 enables the charge pumps CHP3 and CHP4 to operate as a charge pump.

Effects of First Embodiment

A voltage generation circuit according to a comparison example includes a plurality of charge pumps in the same manner as that of the first embodiment, and increases or decreases the number of charge pumps which are enabled in accordance with a load of the voltage generation circuit. In this configuration, while the load is small, the number of disabled charge pumps is increased, and usage of the charge pump is decreased. In addition, there is a case in which the voltage generation circuit separately provides a pool capacitor and the charge pump, and thereby an output voltage is stabilized. In this case, an area for providing a pool capacitor is required.

By contrast, according to the first embodiment, the charge pumps CHP2 to CHP4 may operate not only as a charge pump, but also as a pool capacitor. Thus, the charge pumps CHP2 to CHP4 which are disabled as a charge pump operate as a pool capacitor. For this reason, it is possible to effectively use the charge pumps CHP2 to CHP4 which do not operate as a charge pump, and an area for providing a pool capacitor is not required. Thus, it is possible to reduce an area of the voltage generation circuit 17 more than that according to the comparison example.

In addition, according to the first embodiment, the charge pumps CHP2 to CHP4 include a plurality of pump units PU, the plurality of pump units PU sequentially starts a pool capacitor operation. For this reason, the voltage drop on the node OUT is smaller than that in a case in which all the pump units start the pool capacitor operation simultaneously. Further, it is possible to perform starting of an operation for each pool capacitor, by a simple configuration using the delay circuits 21, 22, 31, 32, 41, and 42.

Modification Example

Figure 12:
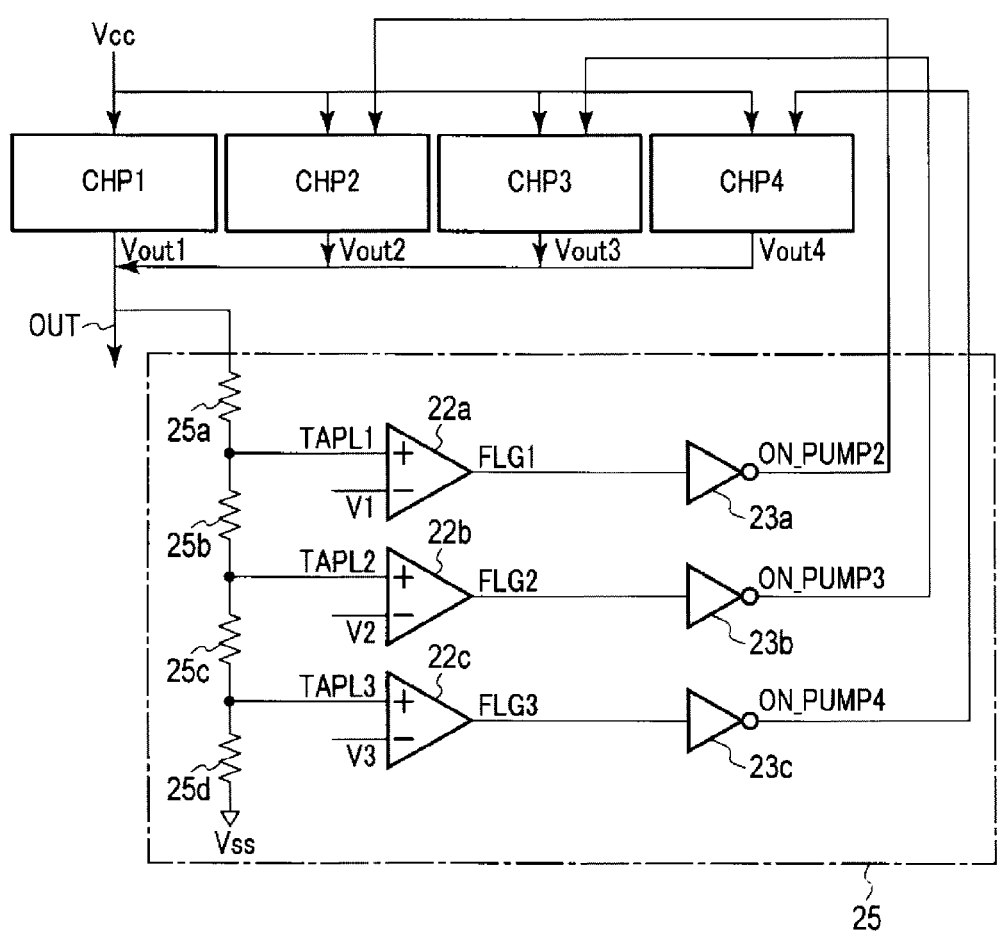
FIG. 12 is a schematic diagram illustrating the charge pump system according to a modification example of the first embodiment.

FIG. 12 illustrates a configuration of a voltage generation circuit 17 (charge pump system 18) according to a modification example. In the modification example, enabling the charge pumps CHP3 and CHP4 as a charge pump is independently controlled.

The charge pump system 18 includes a pump control circuit 25 instead of the pump control circuit 20. The pump control circuit 25 additionally includes a resistor element 25d, an operational amplifier 22c, and a buffer 23c, relative to the configuration of the pump control circuit 20.

The resistor element 25d is connected between the resistor element 25c and the ground. A connection node TAPL3 between the resistor elements 25c and 25d is connected to a non-inverting input terminal of the operational amplifier 22c. An inverting input terminal of the operational amplifier 22c receives a reference voltage V3 (also referred to as VREF3). The operational amplifier 22c outputs the signal FLG3, when a voltage on the node TAPL3 is lower than the voltage V3. An inverter 23c receives the signal FLG3. The inverter 23c outputs the signal ON_PUMP4. The signal ON_PUMP4 of a high level enables the charge pump CHP4 as a charge pump. Resistance values of the resistor elements 25a, 25b, 25c, and 25d, and a value of the voltage V3 are set, in such a manner that, when the voltage on the output node OUT is lower than the reference voltage VREF3, the signal FLG3 of a low level is output. Thus, when the voltage on the output node OUT is lower than the voltage VREF3, the charge pump CHP4 is enabled as a charge pump. The reference voltage VREF3 is lower than the reference voltage VREF2.

Meanwhile, the output signal ON_PUMP3 of an inverter 23b enables the charge pump CHP3 as a charge pump, when the output signal ON_PUMP is in a high level.

In the modification example, when the voltage on the node OUT is lower than the voltage VREF2, the charge pump CHP3 is enabled as a charge pump, and when the voltage on the node OUT is lower than the voltage VREF3, the charge pump CHP4 is enabled as a charge pump.

Figure 13:
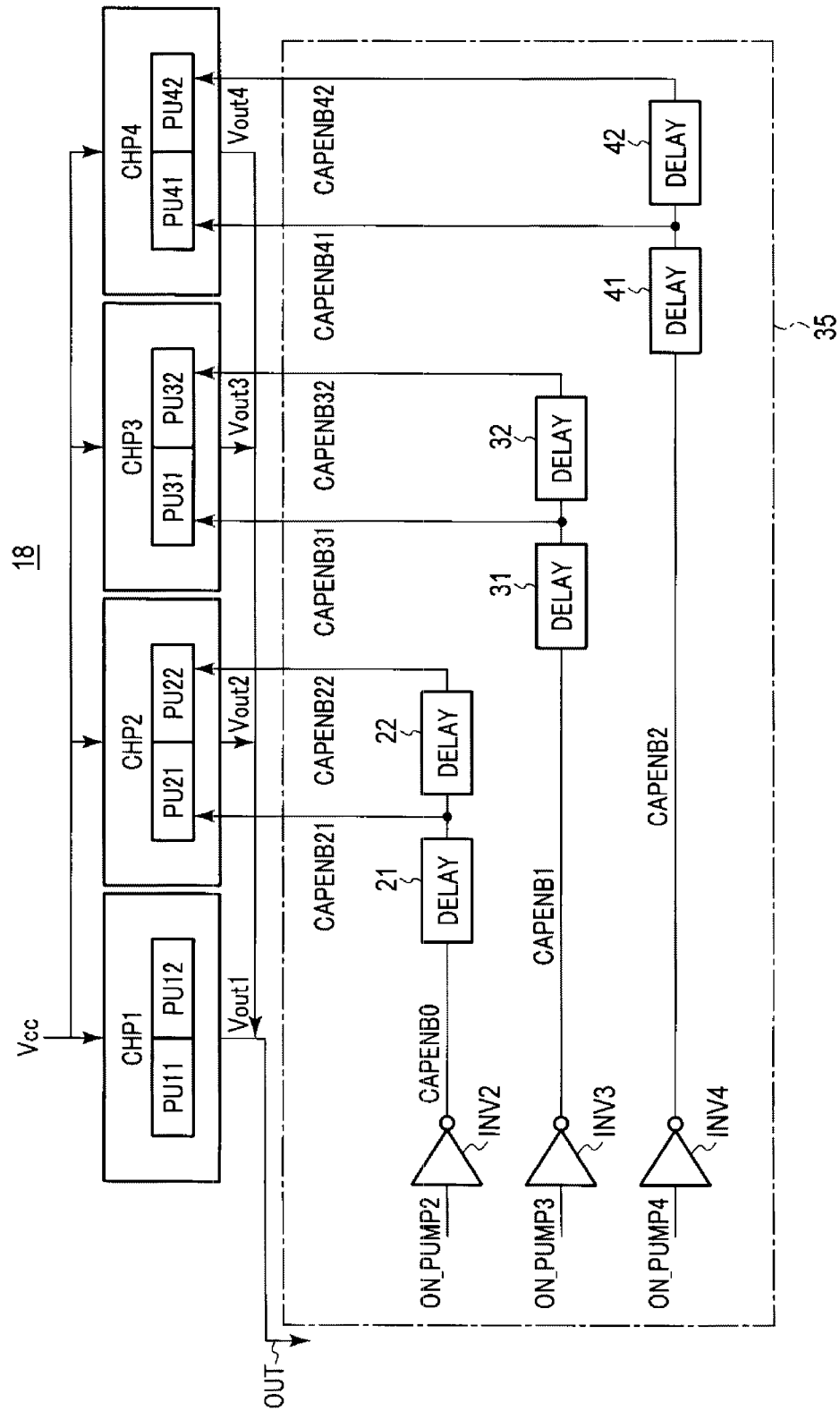
FIG. 13 is a schematic diagram illustrating the charge pump system according to another modification example of the first embodiment.

The charge pump system 18 may also include a pool capacitor control circuit 35, instead of the pool capacitor control circuit 30, as illustrated in FIG. 13. In the pool capacitor control circuit 35, the delay circuit 31 receives the output signal CAPENB1 of the inverter INV3. The inverter INV3 receives the signal ON_PUMP3. In addition, the delay circuit 41 receives the output signal CAPENB2 of the inverter INV4. The inverter INV4 receives the signal ON_PUMP4.

By a configuration of the pool capacitor control circuit 35, only the charge pump CHP2 is enabled as a pool capacitor, when the charge pump CHP2 is disabled as a charge pump. In the same manner, when the charge pump CHP3 is disabled as a charge pump, only the charge pump CHP3 is enabled as a pool capacitor, and when the charge pump CHP4 is disabled as a charge pump, only the charge pump CHP4 is enabled as a pool capacitor.

According to the modification example, it is possible to more precisely control the charge pump, in addition to the effect of the first embodiment.

Second Embodiment

In a second embodiment, the voltage generation circuit includes a flag control mode and an amplitude control mode. In the second embodiment, only the points different from those of the first embodiment will be described. The other points coincide with the description of the first embodiment.

Figure 14:
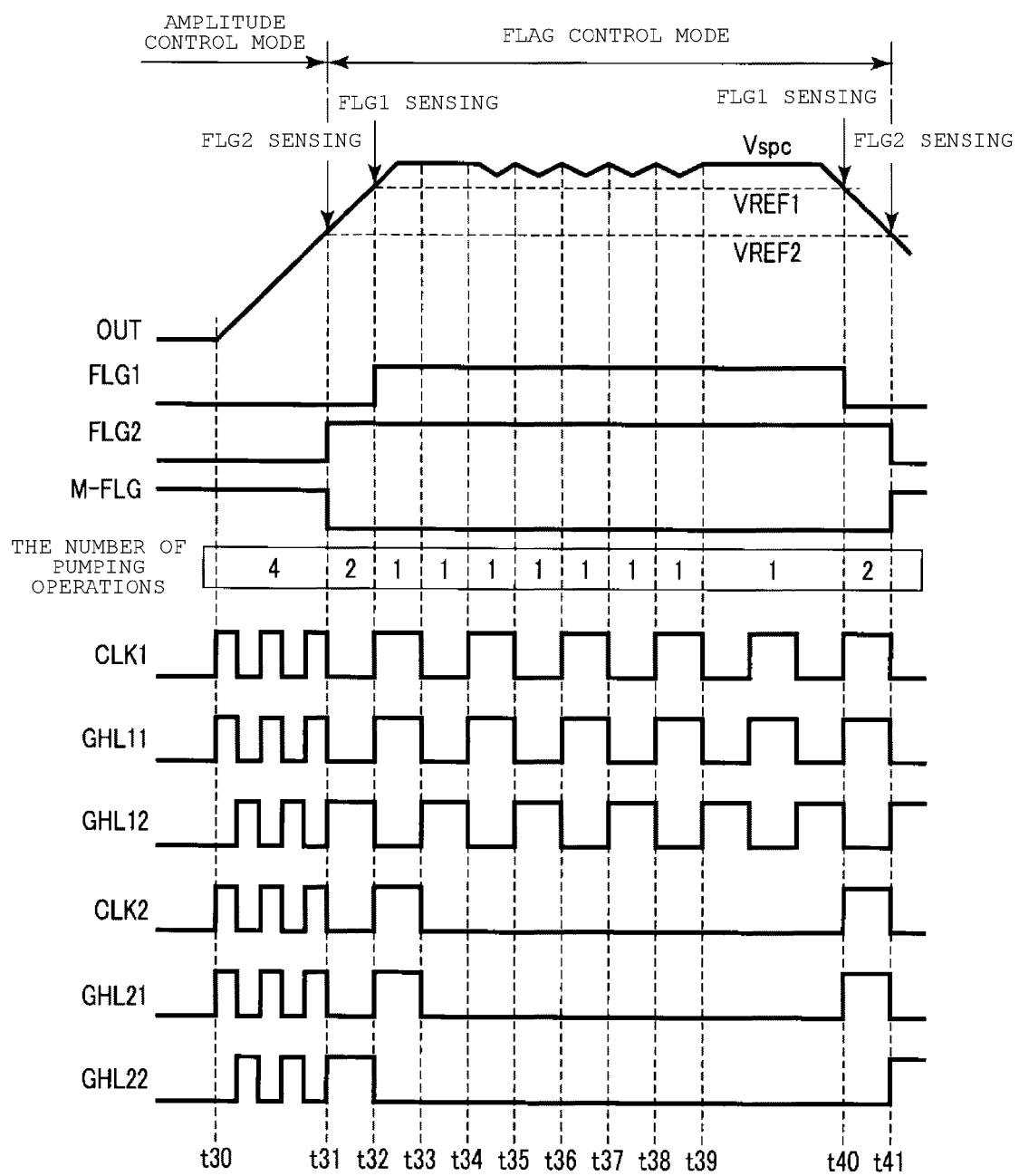
FIG. 14 is a waveform diagram illustrating signals in a charge pump system according to a second embodiment.

FIG. 14 illustrates signals of the charge pump system 18 according to the second embodiment with respect to time. The control circuit 19 transmits a signal M-FLG to the voltage generation circuit 17 (charge pump system 18), and controls an operation mode of the voltage generation circuit 17. The signal M-FLG of a high level indicates an operation in the amplitude control mode. In the amplitude control mode, the control circuit 19 transmits signals CLK2, GHL21, and GHL22 with frequencies higher than the frequencies of signals CLK2, GHL21, and GHL22 in the flag control mode, to the voltage generation circuit 17.

The amplitude control mode is continued from the start (time t30) of the operation of the voltage generation circuit 17 until the output voltage OUT becomes close to the target voltage Vspc. In FIG. 14, for example, the amplitude control mode is continued until the voltage OUT exceeds the reference voltage VREF2, that is, up to a time t31. Thus, in the amplitude control mode, signals FLG1 and FLG2 are in a low level, and all the charge pumps CHP1 to CHP4 operate as a charge pump. In order for the voltage generation circuit 17 to move to the flag control mode, the control circuit 19 decreases the signal M-FLG to a low level at the time t31. In the flag control mode, the operation in the first embodiment is performed.

Figure 15:
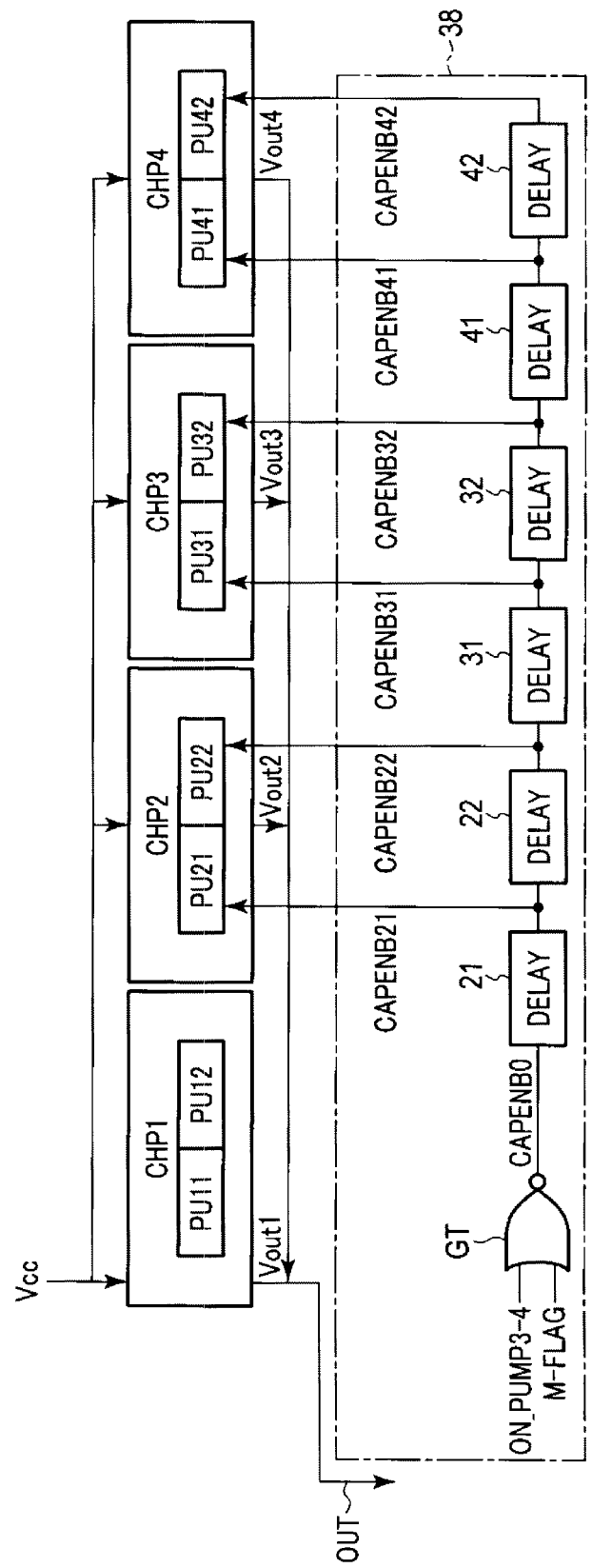
FIG. 15 is a schematic diagram illustrating the charge pump system according to the second embodiment.

The charge pumps CHP2 to CHP4 operate as a pool capacitor, while the voltage generation circuit 17 is in the flag control mode. For this reason, in the pool capacitor control circuit 38 of the second embodiment, as illustrated in FIG. 15, a signal CAPENB0 is output from a NOR gate GT instead of the inverter INV in the first embodiment (FIG. 2). The NOR gate receives the signals ON_PUMP3, ON_PUMP4, and M-FLG. The signal CAPENB0 is maintained at a high level by the configuration of the pool capacitor control circuit 38, while the voltage OUT is higher than the reference voltage VREF2 in the flag control mode.

According to the second embodiment, the first embodiment may also be applied to a voltage generation circuit having an amplitude control mode as well.

In addition to this, the following matters may be applied to each embodiment.

In a reading operating (read) of a multi-value level, a voltage which is applied to a word line that is selected at a reading operation of an A level is, for example, a voltage between 0 V and 0.55 V. The voltage is not limited to this, and may be anyone of voltages between 0.1 V and 0.24 V, between 0.21 V and 0.31 V, between 0.31 V and 0.4 V, between 0.4 V and 0.5 V, and between 0.5 V and 0.55 V.

A voltage which is applied to a word line that is selected at a reading operation of a B level is, for example, a voltage between 1.5 V and 2.3 V. The voltage is not limited to this, and may be anyone of voltages between 1.75 V and 1.8 V, between 1.8 V and 1.95 V, between 1.95 V and 2.1 V, and between 2.1 V and 2.3 V.

A voltage which is applied to a word line that is selected at a reading operation of a C level is, for example, a voltage between 3.0 V and 4.0 V. The voltage is not limited to this, and may be any one of voltages between 3.0 V and 3.2V, between 3.2 V and 3.4 V, between 3.4 V and 3.5 V, between 3.5 V and 3.7 V, and between 3.7 V and 4.0 V.

A time (tR) of a reading operation may be anyone of times, for example, between 25 µs and 38 µs, between 38 µs and 70 µs, and between 70 µs and 80 µs.

A writing operation includes a program operation and a verification operation. In the writing operation, a voltage which is first applied to a word line that is selected at the time of the program operation is a voltage, for example, between 13.7 V and 14.3 V. The voltage is not limited to this, and may be any one of voltages, for example, between 13.7 V and 14.0 V, and between 14.0 V and 14.7 V.

A voltage which is first applied to a word line selected at the time of writing data to odd-numbered word lines may be changed with a voltage which is first applied to a word line selected at the time of writing data to even-numbered word lines.

When the program operation is performed by using an incremental step pulse program (ISPP) method, for example, substantially 0.5 V is used as a step-up voltage.

For example, a voltage between 7.0 V and 7.3 V may be used as a voltage which is applied to an unselected word line. The voltage is not limited to this case, may be a voltage, for example, between 7.3 V and 8.4 V, and may be equal to or lower than 7.0 V.

A pass voltage which is applied may be changed depending on whether the unselected word line is an odd-numbered word line or an even-numbered word line.

Time (tProg) of the writing operation may be any one of times, for example, between 1,700 µs and 1,800 µs, between 1,800 µs and 1,900 µs, and 1,900 µs and 2,000 µs.

In an erasing operation, a voltage that is first applied to a well which is formed in an upper portion of a semiconductor substrate and on the upper portion of which a memory cell is arranged, may be a voltage, for example, between 12 V and 13.7 V. The voltage is not limited to this case, and may be any one of voltages, for example, between 13.7 V and 14.8 V, between 14.8 V and 19.0 V, between 19.0 V and 19.8 V, and between 19.8 V and 21 V.

Time (tErase) of the erasing operation may be any one of times, for example, between 3,000 μs and 4,000 μs, between 4,000 μs and 5,000 μs, and between 5,000 μs and 9,000 μs.

A memory cell includes a charge accumulation layer which is arranged on a semiconductor substrate (silicon substrate) via a tunnel insulating film with a thickness of 4 nm to 10 nm. The charge accumulation layer may have a stacked structure in which an insulating film that has a thickness of 2 nm to 3 nm and is formed of SiN, SiON, or the like is stacked on polysilicon with a thickness of 3 nm to 8 nm, and vice versa. In addition, a metal such as Ru may be contained in the polysilicon. An insulating film is formed on the charge accumulation layer. The insulating film includes, for example, a silicon oxide film with a thickness of 4 nm to 10 nm which is interposed between a lower layer High-k film with a thickness of 3 nm to 10 nm and an upper layer High-k film with a thickness of 3 nm to 10 nm. HfO or the like is used as the High-k film. In addition, a thickness of the silicon oxide film may be greater than a thickness of the High-k film. A control electrode with a thickness of 30 nm to 70 nm is formed on the insulating film via a material with a thickness of 3 nm to 10 nm. The material is a metal oxide film such as TaO, or a metal nitride film such as TaN. W or the like may be used as the control electrode.

In addition, an air gap may be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A charge pump comprising:
    a capacitor;
    a first transistor that is electrically connected between a first terminal of the capacitor and ground;
    a second transistor that is electrically connected between a second terminal of the capacitor and an output node;
    a third transistor that is electrically connected between a source voltage node and the first transistor, and has a gate electrode connected to a gate electrode of the first transistor;
    a fourth transistor that is electrically connected between the source voltage node and the second terminal of the capacitor; and
    a fifth transistor that is electrically connected between the second terminal of the capacitor and the output node,
    wherein, during a first operation mode of the charge pump, a voltage that is boosted using the capacitor is output through the output node, and
    wherein during a second operation mode of the charge pump, the first transistor and the second transistor are maintained in an ON state, and
    wherein, during the first operation mode of the charge pump, a first clock signal is supplied to the gate electrodes of the first transistor and the third transistor, a second clock signal to a gate electrode of the fourth transistor, and a third clock signal to a gate electrode of the fifth transistor.

2. The charge pump according to claim 1, wherein after a voltage at the output node reaches a target voltage, while the voltage at the output node is maintained at the target voltage, the first transistor and the second transistor are maintained in an ON state.

3. The charge pump according to claim 1, wherein after the voltage at the output node reaches a target voltage and a first time period passes, the second transistor is turned on.

4. The charge pump according to claim 1, wherein the first and second clock signals are in phase and are out of phase by 180 degrees with respect to the third clock signal.

5. The charge pump according to claim 4, wherein the first transistor is an n-type metal oxide field effect transistor and the third transistor is a p-type metal oxide field effect transistor.

* * * * *